United States Patent
Japenga

[11] 3,938,034
[45] Feb. 10, 1976

[54] GAS TUBE TESTER
[75] Inventor: Ronald J. Japenga, Glendale Heights, Ill.
[73] Assignee: Reliable Electric Company, Franklin Park, Ill.
[22] Filed: May 6, 1974
[21] Appl. No.: 467,066

[52] U.S. Cl. .............................. 324/20 R; 315/120
[51] Int. Cl.² ........................................ G01R 31/24
[58] Field of Search .......... 324/20, 30 R; 316/1, 27; 315/120, 136

[56] References Cited
UNITED STATES PATENTS

| | | | |
|---|---|---|---|
| 2,928,041 | 3/1960 | Umina | 324/20 R |
| 3,004,213 | 10/1961 | Reid | 324/20 R |
| 3,324,387 | 6/1967 | Brenner | 324/111 |
| 3,466,534 | 9/1969 | Wallace | 324/20 R |
| 3,801,892 | 4/1974 | West | 324/20 R |

Primary Examiner—R. V. Rolinec
Assistant Examiner—Michael J. Tokar
Attorney, Agent, or Firm—Olson, Trexler, Wolters, Bushnell & Fosse, Ltd.

[57] ABSTRACT

The embodiment of the invention disclosed herein is directed to a gas tube tester which provides a pair of terminals for connection to the external electrodes of a cold cathode gas discharge tube. The tester includes one circuit for applying a progressively increasing voltage across the discharge tube so that the breakover voltage of the tube can be determined, this breakover voltage being registered on a meter. A second circuit is provided for testing the leakage current of the gas discharge tube within predetermined limits. A leakage current corresponding to a one megohm internal resistance is sufficient to render conductive a programmable silicon controlled rectifier to give an indication of excessive leakage current.

12 Claims, 1 Drawing Figure

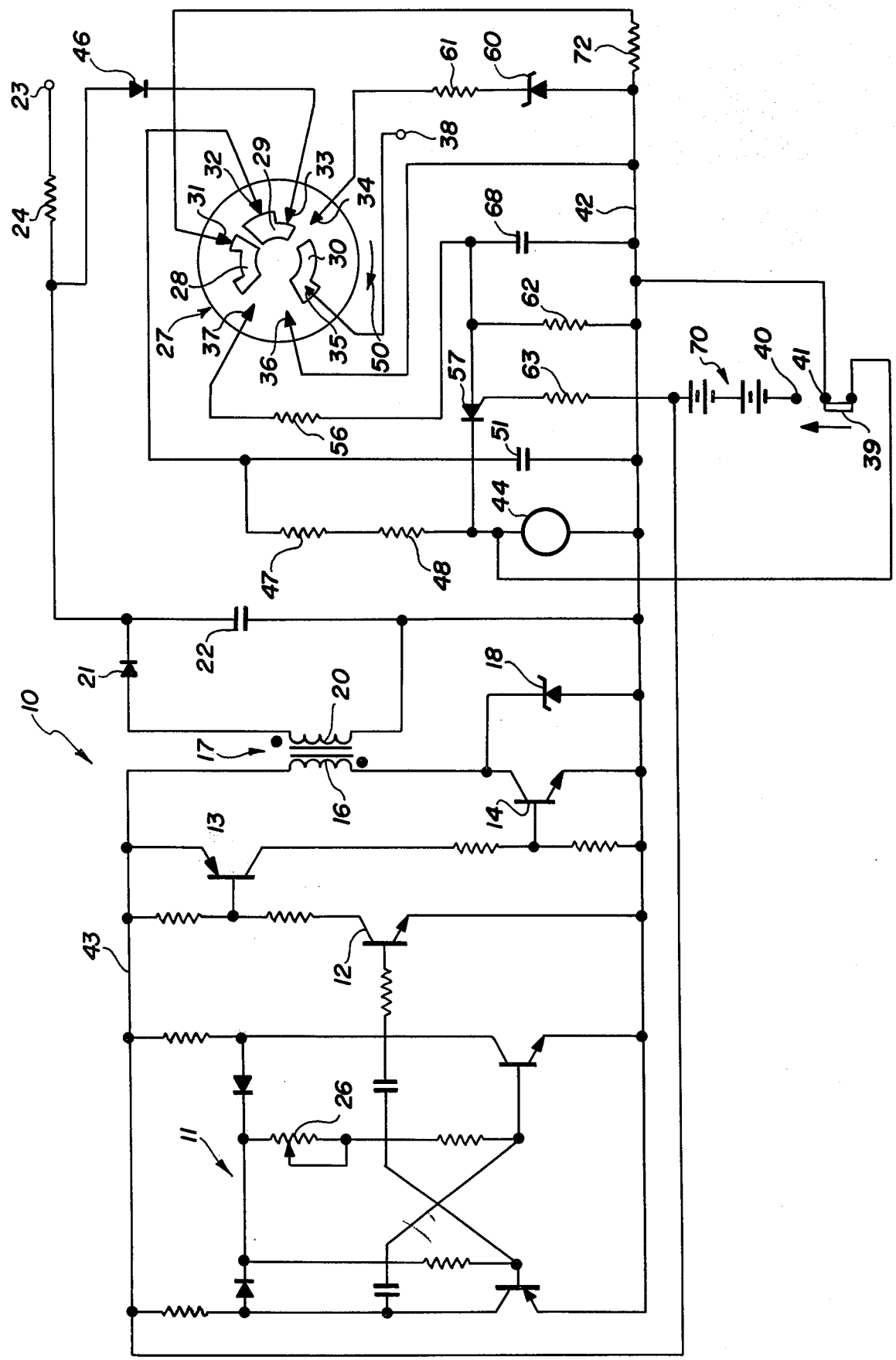

GAS TUBE TESTER

BACKGROUND OF THE INVENTION

This invention relates generally to tube testing apparatus, and more specifically to a gas tube tester for testing both the breakover voltage and the leakage current of cold cathode gas discharge tubes. While the gas tube tester disclosed herein is directed primarily to a tester for testing gas tubes used in telephone line communications systems, it will be understood that other types of gas tubes may be tested.

Line protectors are used in the telephone line circuit to protect against overvoltage and overcurrent conditions which may occur should a power line or lightning bolt strike a telephone line. In many instances these line protectors include carbon elements which provide an arc-over gap. However, many line protector devices are of the type utilizing gas discharge tubes.

Gas discharge tubes are primarily used in line protecting devices located at the central office. The gas discharge tube line protector is a relatively expensive device and its reliability must be insured because of the large quantity of expensive telephone switching equipment to be protected at central office stations. Therefore, the gas discharge tube must be periodically tested to determine its reliability.

One gas discharge tube of the type which can be tested by the apparatus of this invention is disclosed in U.S. Pat. No. 3,755,715, which is assigned to the same assignee of record. It will be understood that other gas discharge devices can be tested with the apparatus of this invention.

Heretofore, testing of gas discharge tubes involved only a breakdown voltage test to determine the breakover voltage at which the gas tube would ionize. While this would give some indication of the relative quality of the tube, a leakage test would also indicate an important quality factor of the tube and would allow a technician to make a better determination of the possibility of further use of the gas discharge tube in a line protector. However, heretofore, leakage devices for gas discharge tubes have been almost nonexistent because of the complexity and high cost of such testing equipment. This complex and expensive equipment, furthermore, was relatively large and could not be portable so that technicians in the field could have ready access to a gas discharge tube tester.

SUMMARY OF THE INVENTION

Accordingly, it is an object of this invention to provide a new and improved gas tube tester which can test both the breakover voltage of a cold cathode gas discharge tube as well as the leakage current through the tube.

Another object of this invention is to provide a new and improved gas tube tester which can test leakage current and which is readily portable for use in the field.

Still another object of this invention is to provide a gas tube tester which can operate for a long period of time from portable battery sources.

Many other objects, features and advantages of this invention will be more fully realized and understood from the following detailed description when taken in conjunction with the accompanying drawings wherein like reference numerals throughout the various views of the drawings are intended to designate similar elements or components.

DESCRIPTION OF THE DRAWING

The drawing is a schematic wiring diagram of a gas tube tester constructed in accordance with the principles of this invention and shows circuitry for testing both the breakover voltage of a gas tube as well as the leakage current through the gas tube.

DETAILED DESCRIPTION OF THE ILLUSTRATED EMBODIMENT

Referring now to the drawing, the gas tube tester of this invention has the circuit configuration illustrated and which is designated generally by reference numeral 10. The circuit 10 includes a free-running multivibrator 11 for producing an output frequency in the order of about 10 KHz which is applied to the base electrode of a first amplifier transistor 12. This signal is then applied to the base electrode of a second amplifier transistor 13 which, in turn, controls a switching transistor 14. The collector and emitter electrodes of the switching transistor 14 are placed in series with a primary winding 16 of a step-up transformer 17. The step-up transformer 17 preferably has a turns ratio of 26 to 1, it being understood that other values may be incorporated. To prevent transient flyback voltages from the transformer 17 from damaging the transistor 14, a zener diode 18 is placed in parallel with the collector and emitter electrodes of the transistor. The zener diode 18 has a breakover voltage of approximately 60 volts.

The step-up transformer 17 has the secondary winding 20 thereof connected through a diode 21 to a capacitor 22. This diode-capacitor network provides a rectification and filtering of the A.C. signal coupled through the transformer. During an initial setting-up condition, the voltage applied to a terminal 23 through a resistor 24 is selected to be about 1000 volts. The value of this voltage is adjustable by means of a potentiometer 26 located in the free-running multivibrator circuit 11. By providing the voltage adjustment in this manner, a decrease in battery supply voltage, due to aging batteries, can be compensated for by adjusting the potentiometer 26 to maintain the 1000 volt reading on the terminal 23. It will be understood that this is an initial static voltage reading and no current flow passes from terminal 23.

A rotary-type mode selector switch 27 has a plurality of arcuately spaced apart contact segments 28, 29 and 30 which engage selected ones of a plurality of wiper contact points 31, 32, 33, 34, 35, 36 and 37. The mode selector switch 27 enables the user to set a breakover voltage testing condition as well as a leakage current testing condition.

A gas tube to be tested is connected between the terminal 23 and a terminal 38 which, in turn, is connected to wiper contact 35 engaging the contact segment 30. This then maintains an open circuit condition across the gas tube when it is connected and enables the user to set the voltage at terminal 23 to 1000 volts as mentioned above. This is accomplished when a push-to-test switch 39 is actuated to have the contact element thereof bridge terminals 40 and 41 to apply battery voltage to lines 42 and 43. It will be noted that when the switch is in the position shown, the meter movement of an indicating microamp meter 44 is shunted for protective purposes. The meter 44 may be a fifty microamp meter.

When the voltage on terminal 23 is to be set at 1000 volts, this reading is sensed through a diode 46, the contacts 32 and 33 passing through the contact segment 29 and a pair of series connected resistors 47 and 48 through the meter 44. The values of resistors 47 and 48 are selected so that a full scale reading of meter 44 indicates a 1000 volt condition at terminal 23. For example, with a 50 microamp meter, a pair of 10 megohm one watt resistors are used.

When the breakover voltage of a gas tube is to be tested, the selector switch 27 is rotated as indicated by arrow 50 so that terminal 38 is now connected to line 42 through the contacts 35 and 36 through the contact segment 30. Diode 46 is maintained in the circuit through the contact segment 29. At the initial testing condition, no voltage is applied to terminal 23 as the free-running multivibrator 26 is inoperative. The test switch 39 is then actuated to start operation of the multivibrator. This will cause the voltage across capacitor 22 to build up and be applied to terminal 23. As the voltage on terminal 23 increases, so also does the voltage applied across a capacitor 51, which is in parallel with the meter and series resistors. When the breakover voltage of the gas tube is reached, the voltage at terminal 23 immediately decreases to the ionization voltage and the breakover voltage is thereby determined by the meter setting of microamp meter 44. Diode 46 prevents reverse current flow from the high voltage setting of the breakover voltage to the ionization voltage now sensed at terminal 23.

Release of the press-to-test switch 39 will reset the entire circuit. A leakage test is accomplished by further rotation of the selector switch 27 to place terminal contact 35 in connection with terminal contact 37 through the contact segment 30, in this instance terminal contact 36 is bypassed. Therefore, the terminal 38 connected to the gas tube is now connected to a resistor element 56 and to the anode of a programmable silicon controlled rectifier 57. In this instance the voltage applied across the terminals 23 and 38 is in the order of about 60 volts, this being obtained from a 60 volt zener diode 60 connected in series with a current limiting resistor 61. The voltage regulated by diode 60 is applied to terminal 23 and through the gas tube being tested to terminal 38 and therefrom to the anode of the programmable silicon controlled rectifier 57. The value of resistor 56 is selected in conjunction with the value of a pair of resistors 62 and 63 connected to the anode and gate electrodes, respectively, so that the programmable silicon controlled rectifier will become conductive when a predetermined leakage current is sensed. In the illustrated embodiment, the value of resistor 56 is in the order of about 470 K ohms and the value of resistors 62 and 63 is in the order of about 100 K ohms. This circuit arrangement will cause the programmable silicon controlled rectifier 57 to be rendered conductive when a leakage current corresponding to a one megohm internal resistance is sensed. Capacitor 68 is connected between the anode of programmable silicon controlled rectifier 57 and line 42 to act as a transient suppression device.

During each testing function the press-to-test switch 39 is operated to place a battery supply 70 in circuit with the multivibrator 11 and amplifiers 12, 13 and 14. The gas tube tester is intended to be portable and the battery supply 70 preferably is a pair of 1½ volt cells thereby providing a total of 3 volts for operating the circuit. When the voltage of the battery supply decreases, due to aging conditions or excessive use, the 1000 volt condition at terminal 23 can be adjusted by varying the potentiometer 26. This will cause the duty cycle of the free-running multivibrator to shift so that more current passes through the primary winding 16 of the step-up transformer 17.

Resistor 72 is placed in series with capacitor 51 when the selector switch 27 is rotated from the breakover voltage testing condition to the leakage current testing condition. This will substantially immediately discharge capacitor 51 through resistor 72 so that the high breakover voltage which was previously sensed will not be applied to the leakage testing current.

What has been described is a simple and efficient gas tube testing circuit arrangement which not only tests the breakover voltage of a gas tube but also tests the leakage current therethrough. While only a single specific embodiment of the invention has been disclosed herein, it will be understood that variations and modifications may be effected without departing from the spirit and scope of the novel concepts as set forth in the following claims.

The invention is claimed as follows:

1. A gas tube tester comprising in combination: terminal means for connection to the external terminals of a cold cathode gas discharge tube to be tested, a first circuit arrangement selectively connected to said terminal means for applying a progressively increasing voltage to said terminal means, said progressively increasing voltage ultimately reaching a breakover voltage of the gas tube being tested, first detector means for sensing said breakover voltage, indicating means connected to said first detector means for indicating said breakover voltage, a second circuit arrangement selectively connected to said terminal means for applying a fixed voltage of predetermined value to establish a static leakage current through the gas discharge tube being tested, and a second detector means for sensing said static leakage current flowing through said gas tube being tested, said detector means including switching means for producing a discharge current therethrough when the static leakage current through said gas tube being tested exceeds a predetermined minimum value.

2. The gas tube tester as set forth in claim 1 wherein said first and second circuit means are selectively connected to said first and second detectors by a rotary selector switch.

3. The gas tube tester as set forth in claim 1 wherein said second detector means includes a programmable silicon controlled rectifier connected in series with said terminal means for producing said discharge current therethrough when the leakage current through the gas tube being tested exceeds a predetermined minimum value.

4. The gas tube tester as set forth in claim 3 wherein the fixed voltage applied to the second circuit is 60 volts and a 470 K ohm resistor is connected in series with said programmable silicon controlled rectifier.

5. The gas tube tester as set forth in claim 4 wherein a 100 K ohm resistor is connected between the anode of said programmable silicon controlled rectifier and ground potential and a 0.01 microfarad capacitor is connected in parallel with said 100 K ohm resistor.

6. The gas tube tester as set forth in claim 1 wherein said first circuit means applies 1000 volts to said terminal means and said second circuit means applies 60 volts to said terminal means and including switch terminals connected to a zener diode and a current limiting resistor in series therewith to limit the voltage to said second circuit at 60 volts.

7. The gas tube tester as set forth in claim 1 wherein said second detector is rendered operative when the gas tube has a leakage current corresponding to a one megohm resistor.

8. A gas tube tester comprising in combination: terminal means for connection to the external terminals of a cold cathode gas discharge tube to be tested, a circuit arrangement selectively connected to said terminal means for applying a fixed voltage of predetermined value to establish a leakage current through the gas discharge tube being tested, detector means for sensing a predetermined static leakage current flowing through said gas tube being tested, said detector means including a solid state switching device to be rendered conductive when said predetermined leakage current through the gas tube is sensed.

9. The gas tube tester as set forth in claim 8 wherein said detector means includes a programmable silicon controlled rectifier connected in series with said terminal means for producing current flow therethrough when the leakage current through the gas tube being tested exceeds a predetermined minimum value.

10. The gas tube tester as set forth in claim 9 wherein the fixed voltage applied to the second circuit is 60 volts and a 470 K ohm resistor is connected in series with said programmable silicon controlled rectifier.

11. The gas tube tester as set forth in claim 10 wherein a 100 K ohm resistor is connected between the anode of said programmable silicon controlled rectifier and ground potential and a 0.01 microfarad capacitor is connected in parallel with said 100 K ohm resistor.

12. The gas tube tester as set forth in claim 8 wherein said detector means is rendered operative when the gas tube has a leakage current corresponding to a one megohm resistor.

* * * * *